United States Patent
Sneh

(10) Patent No.: US 8,673,394 B2
(45) Date of Patent: Mar. 18, 2014

(54) DEPOSITION METHOD AND APPARATUS

(75) Inventor: Ofer Sneh, Boulder, CO (US)

(73) Assignee: Sundew Technologies LLC, Broomfield, CO (US)

( * ) Notice: Subject to any disclaimer, the term of this patent is extended or adjusted under 35 U.S.C. 154(b) by 612 days.

(21) Appl. No.: 12/991,918

(22) PCT Filed: May 6, 2009

(86) PCT No.: PCT/US2009/042920
§ 371 (c)(1),
(2), (4) Date: Nov. 10, 2010

(87) PCT Pub. No.: WO2009/142905
PCT Pub. Date: Nov. 26, 2009

(65) Prior Publication Data
US 2011/0070141 A1      Mar. 24, 2011

Related U.S. Application Data

(60) Provisional application No. 61/054,496, filed on May 20, 2008.

(51) Int. Cl.
*C23C 16/00* (2006.01)
(52) U.S. Cl.
USPC ........................ 427/248.1; 118/715
(58) Field of Classification Search
USPC ...................... 427/248.1; 118/715
See application file for complete search history.

(56) References Cited

U.S. PATENT DOCUMENTS

| | | |
|---|---|---|
| 4,806,074 A | 2/1989 | Burger et al. |
| 5,116,196 A | 5/1992 | Baret et al. |
| 5,944,049 A | 8/1999 | Beyer et al. |
| 6,464,451 B1 | 10/2002 | Conrad et al. |
| 6,499,973 B2 | 12/2002 | Maejima |
| 6,676,384 B2 | 1/2004 | Eberl |
| 6,702,544 B1 | 3/2004 | Palten et al. |

(Continued)

FOREIGN PATENT DOCUMENTS

WO  2004083485 A2  9/2004

OTHER PUBLICATIONS

M. Ritala et al., Handbook of Thin Film Materials, vol. 1: Deposition and Processing of Thin Films, 2002, pp. 103-159, Academic Press.

(Continued)

*Primary Examiner* — Elizabeth Burkhart
(74) *Attorney, Agent, or Firm* — Law Offices of Michael L. Wise, LLC

(57) ABSTRACT

A method of depositing a material on a substrate comprises placing a substrate into a process space in fluidic communication with a Gaede pump stage (GPS). A precursor gas is then injected into the process space while injecting a draw gas at a draw gas flow rate into the GPS such that the injected precursor gas achieves a precursor pressure and a precursor gas flow rate in the process space. Subsequently, substantially all of the precursor gas remaining in the process space is swept from the process space by injecting a sweep gas into the process space such that the injected sweep gas achieves a sweep pressure and sweep gas flow rate in the process space. The precursor pressure is higher than the sweep pressure, and the precursor gas flow rate is lower than the sweep gas flow rate.

15 Claims, 8 Drawing Sheets

(56) References Cited

U.S. PATENT DOCUMENTS

| | | | |
|---|---|---|---|
| 6,876,114 | B2 | 4/2005 | Knotts et al. |
| 6,911,092 | B2 * | 6/2005 | Sneh .................... 118/715 |
| 7,020,981 | B2 | 4/2006 | Shero et al. |
| 7,066,712 | B2 | 6/2006 | Kim et al. |
| 7,086,827 | B2 | 8/2006 | Mokler |
| 7,118,353 | B2 | 10/2006 | Maruyama et al. |
| 7,140,833 | B2 | 11/2006 | Bailey |
| 7,165,931 | B2 | 1/2007 | Olivier et al. |
| 2002/0076490 | A1 | 6/2002 | Chiang et al. |
| 2003/0180458 | A1 * | 9/2003 | Sneh .................... 427/248.1 |
| 2006/0060139 | A1 | 3/2006 | Meneghini et al. |

OTHER PUBLICATIONS

S.M. George et al., Surface Chemistry for Atomic Layer Growth, J.Phys. Chem., 1996, pp. 13121-13131, vol. 100, American Chemical Society.

O. Sneh et al., Thin film atomic layer deposition equipment for seminconductor processing, Thin Solid Films, 2002, pp. 248-261, vol. 402, Elsevier Science.

O. Sneh, Strategies for high-productivity ALD, Solid State Technology, 2003.

S. Giors et al., Computational fluid dynamic model of a tapered vacuum pump operating in the viscous and transition regimes. I. Vacuum performance, J. Vac. Sci. Technol., 2006, p. 1584-1591, vol. A 24(4), American Vacuum Society.

J.W. Klaus et al., Growth of SiO2 at Room Temperature with the Use of Catalyzed Sequential Half-Reactions, Science, 1997, pp. 1934-936, vol. 278, American Association for the Advancement of Science.

A.D. Chew et al, Towards the single pump solution: Recent developments in high speed machines for dry vacuum pumping, J. Vac. Sci. Technol., 2005, pp. 1314-1318, vol. A 23(5), American Vacuum Society.

P. Duval et al., The molecular drag pump: Principle, characteristics, and applications, J. Vac. Sci. Technol., 1988, pp. 1187-1191, vol. A 6(3), American Vacuum Society.

M. Spagnol et al., Turbomolecular pump design for high pressure operation, J. Vac. Sci. Technol., 1998, pp. 1151-1156, vol. A 16(3), American Vacuum Society.

F. Sharipov et al., Numerical modeling of the Holweck pump, J. Vac. Sci. Technol., 2005, pp. 1331-1339, vol. A 23 (5), American Vacuum Society.

M. Leskela et al., Atomic Layer Deposition Chemistry: Recent Developments and Future Challenges, Angnew. Chem. Int. Ed., 2003, pp. 5548-5554, vol. 42, Wiley-VCH Verlag GmbH & Co.

P. Danielson, How to Choose a Roughing/Backing Pump for the Turbo and Drag Family, A Journal of Pracitcal and Useful Vacuum Technology, The Vacuum Lab.

Working with Turbopumps: Introduction to high and ultra high vacuum products, Pfeifer Vacuum.

P. Barney et al., Active Control of Magnetically Levitated Bearings, Sandia Report, 2001, SAND2001-0757, Sandia National Labs.

R. Schob, Centrifugal pump without bearings or seals, World Pumps, 2002, pp. 2-5, Elsevier Science Ltd.

K. Boden et al., Industrial Realization of the "SYTEM KFA-JULICH" Permanent Magnet Bearing Lines, Proceedings of the MAG '92 Magnetic Bearings, Magnetic Drives and Dry Gas Seals Conference & Exhibition, 1992, Technomic Publishing Co.

E.J. Blumber, Testing of a Magnetically Levitated Rocket Thrust Measurement System Demonstrator for NASA, Thesis at Virginia Polytechnic Institute and State University, 2002, pp. 1-129.

A.O. Smith Motor Mastery University, The AC's & DC's of Electric Motors, 2002, pp. 1-40, A.O. Smith Corporation.

A. Nagorny et al, High Speed Permanent Magnet Synchronous Motor/Generator Design for Flywheel Applications, Presentation, Glenn Research Center.

K. Minoru, Application of Permanent Magnet Synchronous Motor to Driving Railway Vehicles, Railway Technology Avalanche, 2003, p. 6, vol. 1.

A. Nagorny et al., Design Aspects of a High Speed Permanent Magnet Synchronous Motor/Generator for Flywheel Applications, NASA/TM—2005-213651, 2005, pp. 1-7.

* cited by examiner

DEPOSITION METHOD AND APPARATUS

FIELD OF THE INVENTION

The present invention relates generally to methods and apparatus for depositing materials on substrates, and, more particularly, to methods and apparatus for depositing materials on substrates using atomic layer deposition with modulated pressures and gas flow rates.

BACKGROUND OF THE INVENTION

Atomic layer deposition (ALD) provides highly conformal material coatings with exceptional quality, atomic layer control, and uniformity. Coatings deposited by ALD are, for example, well suited for protecting many products from corrosion and harsh ambient conditions. Effective corrosion protective ALD coatings may only be about 200 to about 1,000 nanometers (nm) thick, making them thin enough not to impact the dimensions or the bulk properties of most of the parts and products on which they are deposited. Moreover, ALD coatings typically display excellent conformality and hermetic sealing properties. As a result, potential applications for ALD coatings are wide ranging. They include microelectronic packaging, medical devices, microelectromechanical systems, carbon nanotube assemblies, flat panel displays, high-end consumer and aerospace parts, printed circuit boards, tools, solar panels, and a myriad of other applications.

Fundamentally, repetitive ALD process cycles consist at the very minimum of two reaction sub-steps. Typically, in a first reaction sub-step, a substrate is exposed to a first precursor gas $ML_x$ having a metal element M (e.g., M=Al, W, Ta, or Si.) that is bonded to an atomic or molecular ligand L. The substrate surface is typically prepared to include hydrogen-containing ligands AH (e.g., A=O, N, or S). These hydrogen-containing ligands react with the first precursor gas to deposit a layer of metal by the reaction:

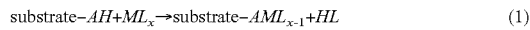

$$\text{substrate-}AH+ML_x \rightarrow \text{substrate-}AML_{x-1}+HL \qquad (1)$$

where the hydrogen containing molecule HL is a reaction by-product. During the reaction, the AH surface ligands are consumed, and the surface becomes covered with L ligands from the first precursor gas, which cannot react further with that gas. As a result, the reaction self-terminates when substantially all the AH ligands on the surface are replaced with $AML_{x-1}$ species. This reaction sub-step is typically followed by an inert-gas (e.g., $N_2$ or Ar) sweep sub-step that acts to sweep substantially all of the remaining first precursor gas from the process space in preparation for the introduction of a second precursor gas.

The second precursor gas is used to restore the surface reactivity of the substrate towards the first precursor gas. This is done, for example, by removing the L ligands on the substrate and re-depositing AH ligands. In this case, the second precursor gas typically consists of $AH_y$ (e.g., $AH_y=H_2O$, $NH_3$, or $H_2S$). The reaction:

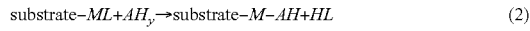

$$\text{substrate-}ML+AH_y \rightarrow \text{substrate-}M-AH+HL \qquad (2)$$

converts the surface of the substrate back to being AH-covered (note that this reaction as stated is not balanced for simplicity). The desired additional element A is incorporated into the film and the undesired ligands L are substantially eliminated as volatile by-product. Once again, the reaction consumes the reactive sites (this time, the L-terminated sites) and self-terminates when those sites are entirely depleted. The remaining second precursor gas is then removed from the process space by another sweep sub-step.

The sub-steps consisting of reacting the substrate with the first precursor gas until saturation and then restoring the substrate to a reactive condition with the second precursor gas form the key elements in an ALD process cycle. These sub-steps imply that films can be layered down in equal, metered cycles that are all identical in chemical kinetics, deposition per cycle, composition, and thickness. Moreover, self-saturating surface reactions make ALD insensitive to precursor transport non-uniformities (i.e., spatial non-uniformity in the rate that the precursor gases impinge on the substrate) that often plague other deposition techniques like chemical vapor deposition and physical vapor deposition. Transport non-uniformities may result from equipment deficiencies or may be driven by substrate topography. Nonetheless, in the case of self-saturating ALD reactions, if each of the reaction sub-steps is allowed to self-saturate across the entire substrate surface, transport non-uniformities become irrelevant to film growth rate.

As described generally above, an ALD process cycle requires two reaction sub-steps and their associated sweep sub-steps. If each reaction sub-step is further particularized into an injection sub-step, wherein the respective precursor gas is injected into the reaction space, and a reaction sub-step, then a single process cycle actually consists of six sub-steps in total:

1. $ML_x$ injection
2. $ML_x$ reaction
3. $ML_x$ sweep
4. $AH_y$ injection
5. $AH_y$ reaction
6. $AH_y$ sweep.

The highest productivity is achieved when each of these sub-steps completes as quickly as possible. In fact, because it frequently requires about 2,000 ALD process cycles to complete an encapsulation process, each cycle will preferably require less than about one second. Productivity is, of course, also affected by other factors. In addition to cycle time, productivity is also affected by equipment uptime (i.e., the fraction of the time that the equipment is up and running properly), cost of consumables (e.g., precursor gases, sweep gases), cost of maintenance, power, overhead (e.g., floor space), and labor.

Reaction rates during the reaction sub-steps tend to scale with the flux of precursor gases on the substrate, which, in turn, scale with the partial pressure of that precursor gas in the process space. Most ALD processes are performed at the low to moderate substrate temperature range of about 100-300 degrees Celsius (° C.). At these lower temperatures, reaction rates are relatively slow or only moderate in speed. As a result, substantial exposures (e.g., about $10^2$-$10^5$ Langmuirs (L)) of precursor gas may be needed to reach saturation. In these cases, high precursor gas pressure is typically the only way to speed up the reaction sub-steps. Accordingly, reaction sub-steps are preferably executed at the highest possible pressure of undiluted precursor gas. In contrast, typically very minimal gas flow is needed during the reaction sub-steps to supplement for reactive precursor depletion. Instead, higher gas flow rates will only result in extensive precursor waste. Since many of the precursor gases used in ALD are extremely reactive, un-reacted precursor gas that is swept through the process space swiftly drives the equipment to malfunction or to fail. It is therefore preferably that reaction sub-steps are performed with the highest pressures and the lowest gas flow rates.

Effective sweep sub-steps, in contrast, preferably utilize high gas flow rates of the sweep gas to substantially remove any precursor gas from the process space before introducing the complementary precursor gas into this space. Dilution by a factor of about 100-500 during a sweep sub-step is generally considered by those who are skilled in the art to be sufficient to promote high quality ALD growth. Required sweep sub-step times scale with the sweep residence time, $\tau_s = V \times P_s / Q_s$, where V is the volume of the process space, $P_s$ is the pressure of sweep gas in the process space, and $Q_s$, is the gas flow rate of the sweep gas in the process space. Based on the 100-500 dilution criteria, effective sweep times will exceed about 4.5 $\tau_s$. Based on this formula, one will recognize that, to reduce required sweep sub-step time, process space volume is preferably minimized when designing the deposition system. Moreover, sweep sub-step time may be reduced by using lower sweep gas pressures and higher sweep gas flow rates. The sweep sub-steps therefore display trends with respect to pressure and gas flow rate that are opposite to those described above for the reaction sub-steps.

Injection sub-steps drive a concurrent flow-out ("draw") of sweep gas form the process space while it is loaded with the appropriate precursor gas. The time required for the injection sub-steps scales with injection residence time $\tau_i = V P_i / Q_i$, where $P_i$ is the pressure of the precursor gas in the process space, and $Q_i$ is the gas flow rate of the precursor gas in the process space. Accordingly low pressures and high gas flow rates allow the injection sub-steps to be faster. Bearing in mind, however, that precursor waste and related equipment failure, downtime, and maintenance are perhaps the most dominant cost factors, best ALD practices generally dictate that injection sub-steps not be carried out beyond 35% volume exchange (e.g., about $\tau_i$) under these gas flow rate conditions. Otherwise, high concentration loading will result in excessive precursor waste during the injection sub-step. For example, to reach greater than 99% concentration of precursor gas in the process space during an injection sub-step, the required injection time of about $4.5\tau_i$ will result in more than 58% precursor waste just for that injection sub-step. This restriction further emphasizes the need for high pressure during the reaction sub-steps to compensate for less than 100% concentrations of precursor gas in the process space.

Based on these trends, one can see that conventional ALD clearly suffers from a fundamental tradeoff: injection and sweep sub-steps are made faster with lower pressures and higher gas flow rates while reaction sub-steps are made faster and less wasteful of precursor gases with higher pressures and lower gas flow rates. To overcome this tradeoff, process pressure and gas flow rates are preferably modulated in a synchronized manner with the different ALD sub-steps. Nevertheless, driving higher gas flow rates in many apparatus known in the art results in higher pressures so that any advantageous effects for ALD applications are lost. For example, the residence time $\tau = V \times P/Q$ does not modulate when both pressure, P, and gas flow rate, Q, are modulated in phase with each other by roughly the same factor. Moreover, pressure/gas-flow-rate modulation techniques known in the art tend to employ relatively slow mechanical devices that modulate conductance (e.g., throttle valves) or devices that modulate pumping speed (e.g., devices that change the speed at which a component of the pump moves or rotates). These devices are not practical for the sub-second execution of ALD. For efficient ALD, the time required to modulate pressure and gas flow rates should not ideally exceed 10% of the process cycle time. For example, 100 milliseconds (ms) out of a one second cycle time leaves only about 25 ms for each pressure/gas-flow-rate transition (there are four such transitions per process cycle). Excluding other drawbacks, a transition time of about 25 ms is at least 100 times faster than the speed of most mechanical and pump speed modulation methodologies.

A novel ALD apparatus and method were taught by the inventor of the present invention in U.S. Pat. No. 6,911,092, entitled "ALD Apparatus and Method," commonly assigned herewith and incorporated by reference herein. Aspects of this invention are shown in the schematic diagram shown in FIG. 1. As indicated in the figure, a "Synchronously Modulated Flow Draw" (SMFD) ALD system 100 comprises a first precursor gas source 101, a sweep gas source 102, and a second precursor gas source 103. These sources are plumbed into a first precursor gas valve 105, a sweep gas valve 106, and a second precursor gas valve 107, respectively, which control the flow of these process gases into inlets of a process space 110. Further downstream, a process space flow restriction element (FRE) 115 is attached to an outlet of the process space and carries gas drawn out of the process space into a small-volume draw gas introduction chamber (DGIC) 116. A draw gas source 120 is connected to the DGIC through a draw gas valve 121 and a draw gas FRE 122. Any gases drawn out of the DGIC enter a DGIC FRE 130 and then an abatement space 132, which contains an abatement surface 134. The abatement space is connected to an abatement gas source 138 and an abatement gas valve 139. The system is pumped by a vacuum pump 140.

The SMFD ALD system 100 is adapted to run process cycles comprising the six sub-steps described above. During sweep sub-steps, the draw gas valve 121 is closed and no draw gas is allowed to enter the DGIC 116. This, in turn, allows sweep gases injected into the process space to achieve relatively low pressures and relatively high gas flow rates. In contrast, during injection and reactions sub-steps, the draw gas valve is opened and draw gas is injected into the DGIC, allowing precursor gases injected into the process space to rapidly achieve relatively high pressures while accommodating relatively low gas flow rates. More particularly, given the small volume of DGIC and the high flow of the draw gas, a substantial pressure gradient quickly develops over the DGIC FRE 130 when draw gas is injected into the DGIC. As a result, pressure in the DGIC quickly increases and the pressure gradient over the process space FRE 115, $\Delta P_{Draw}$, quickly decreases. In this manner, the gas flow rate out of the process space is modulated by effectively modulating $\Delta P_{Draw}$. If the DGIC has a small volume, very fast transition speeds may be obtained. For example, a DGIC having a volume of about 75 cubic centimeters ($cm^3$) implemented within a commercially available SMFD ALD system designed to deposit materials on eight inch wafer-sized substrates is capable of less than 5 ms transition times.

For gas abatement purposes, an abatement gas from the abatement source 138 is introduced through the abatement gas valve 139 into the abatement space 132 during reaction and the initial stage of sweep sub-steps to drive an efficient reaction with any precursor gases that may have passed through the process space 110 without being reacted. The products of this abatement reaction deposit as a solid film on the abatement surface 134, thereby effectively scrubbing the leftover precursor gas waste from the exhaust effluent. Advantageously, the high gas flow rate through the DGIC 116 during reaction sub-steps effectively separates the abatement space from the process space to allow flexible abatement gas selection without affecting the actual ALD process. Abatement accomplished in this manner has been shown to extend pump life significantly over that normally seen in conventional ALD systems.

Based on this brief description as well as the details provided in U.S. Pat. No. 6,911,092, it will be clear to one skilled in the art that SMFD ALD methods and apparatus provide several advantages with respect to productivity, efficiency, and cost over other ALD methods and apparatus known in the art. For this reason, it is desirable to further develop new methods and apparatus for implementation of SMFD-like ALD which may provide even greater advantages and capabilities.

SUMMARY OF THE INVENTION

Embodiments of the present invention address the above-identified need by providing methods and apparatus for depositing materials on substrates by ALD utilizing Gaede pump stages (GPSs) to modulate the pressures and gas flow rates of precursor gases and sweep gases.

In accordance with an aspect of the invention, a method of depositing a material on a substrate comprises placing a substrate into a process space in fluidic communication with a GPS. A precursor gas is then injected into the process space while injecting a draw gas at a draw gas flow rate into the GPS such that the injected precursor gas achieves a precursor pressure and a precursor gas flow rate in the process space. Subsequently, substantially all of the precursor gas remaining in the process space is swept from the process space by injecting a sweep gas into the process space such that the injected sweep gas achieves a sweep pressure and sweep gas flow rate in the process space. The precursor pressure is higher than the sweep pressure, and the precursor gas flow rate is lower than the sweep gas flow rate.

In accordance with another aspect of the invention, an apparatus for depositing a material on a substrate comprises a process space, a GPS in fluidic communication with the process space, and one or more gas manifolds. The process space is adapted to hold the substrate. The one or more gas manifolds are adapted to inject a precursor gas into the process space while injecting a draw gas at a draw gas flow rate into the GPS such that the injected precursor gas achieves a precursor pressure and a precursor gas flow rate in the process space, and to sweep substantially all of the precursor gas remaining in the process space from the process space by injecting a sweep gas into the process space such that the injected sweep gas achieves a sweep pressure and sweep gas flow rate in the process space. The precursor pressure is higher than the sweep pressure, and the precursor gas flow rate is lower than the sweep gas flow rate.

In accordance with even another aspect of the invention, a product of manufacture is formed at least in part by placing at least a portion of the product of manufacture into a process space in fluidic communication with a GPS. A precursor gas is then injected into the process space while injecting a draw gas at a draw gas flow rate into the GPS such that the injected precursor gas achieves a precursor pressure and a precursor gas flow rate in the process space. Subsequently, substantially all of the precursor gas remaining in the process space is swept from the process space by injecting a sweep gas into the process space such that the injected sweep gas achieves a sweep pressure and sweep gas flow rate in the process space. The precursor pressure is substantially higher than the sweep pressure, and the precursor gas flow rate is substantially lower than the sweep gas flow rate.

In accordance with an additional aspect of the invention, a GPS comprises an impeller, an enclosure that laterally surrounds the impeller, a plurality of permanent magnets, and a plurality of electromagnetic coils. The impeller comprises a plurality of blades that span radially from an inner hub to an outer rim. Moreover, the plurality of permanent magnets is attached to the outer rim of impeller, while the plurality of electromagnetic coils is attached to the enclosure and disposed proximate to the outer rim. These electromagnetic coils are adapted to levitate the impeller, rotate the impeller, and center the impeller laterally within the enclosure in response to received electrical signals.

In accordance with one of the above-identified embodiments of the invention, a "Synchronously Modulated Flow Compression Draw" (SMFCD) ALD system comprises a process space adapted to hold a substrate in fluidic communication with a single-impeller, low-volume GPS. The GPS is attached to a draw gas manifold that is operative to inject draw gas into the GPS. Draw gas is injected into the GPS in such a manner as to cause the GPS to at least in part modulate the pressure and gas flow rate conditions in the process space in order to achieve high productivity ALD. When sweep gas is injected into the process space during sweep sub-steps, no draw gas is injected into the GPS and the GPS displays a moderate compression ratio. This allows the sweep gas to achieve relatively low pressures and relatively high gas flow rates within the process space. In contrast, while precursor gases are injected into the process space during injection and reaction sub-steps, draw gas is concurrently injected into the GPS at such a draw gas flow rate that the pressure in the GPS is raised and its compression ratio reduced. This, in turn, allows precursor gases injected into the process space to achieve relatively high pressures and relatively low gas flow rates within in the process space with minimal precursor waste. Downstream from the GPS, an abatement gas is injected into an abatement space during sweep sub-steps to react with any un-reacted precursor gas that is swept from the process space. The abatement gas reacts with the un-reacted precursor gas to form a film on an abatement surface.

Advantageously, aspects of the invention provide several advances to the art of ALD. Aspects of the invention, for example, may allow high productivity ALD systems to be implemented with substantially larger process spaces and with less concern about pressure non-uniformities and design tolerances. Moreover, aspects of the invention may further allow ALD systems to be implemented with higher sweep gas flow rates during sweep sub-steps at reduced pumping requirements. They may also allow ALD systems to be implemented with rapid and effective reactive precursor injection into the process space and minimized precursor waste. In addition, aspects of the invention may allow ALD systems to be implemented with higher overall process space pressures during reaction sub-steps resulting in faster deposition rates for a given substrate temperature and the ability to efficiently perform deposition at lower substrate temperatures. Finally, as one last example, aspects of the invention may further allow ALD systems to be implemented with more efficient abatement of precursor waste.

These and other features and advantages of the present invention will become apparent from the following detailed description which is to be read in conjunction with the accompanying drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

The present invention will be described with reference to illustrative embodiments. For this reason, numerous modifications can be made to these embodiments and the results will still come within the scope of the invention. No limitations with respect to the specific embodiments described herein are intended or should be inferred.

As used herein, the symbol $P_x^y$ shall refer to the pressure at location x during the sub-step y, where y=s for sweep sub-steps, y=i for injection sub-steps, and y=r for reaction sub-steps. Moreover, as used herein, a GPS is meant to encompass any apparatus operative to pump gas by means of a moving surface.

Figure 2:
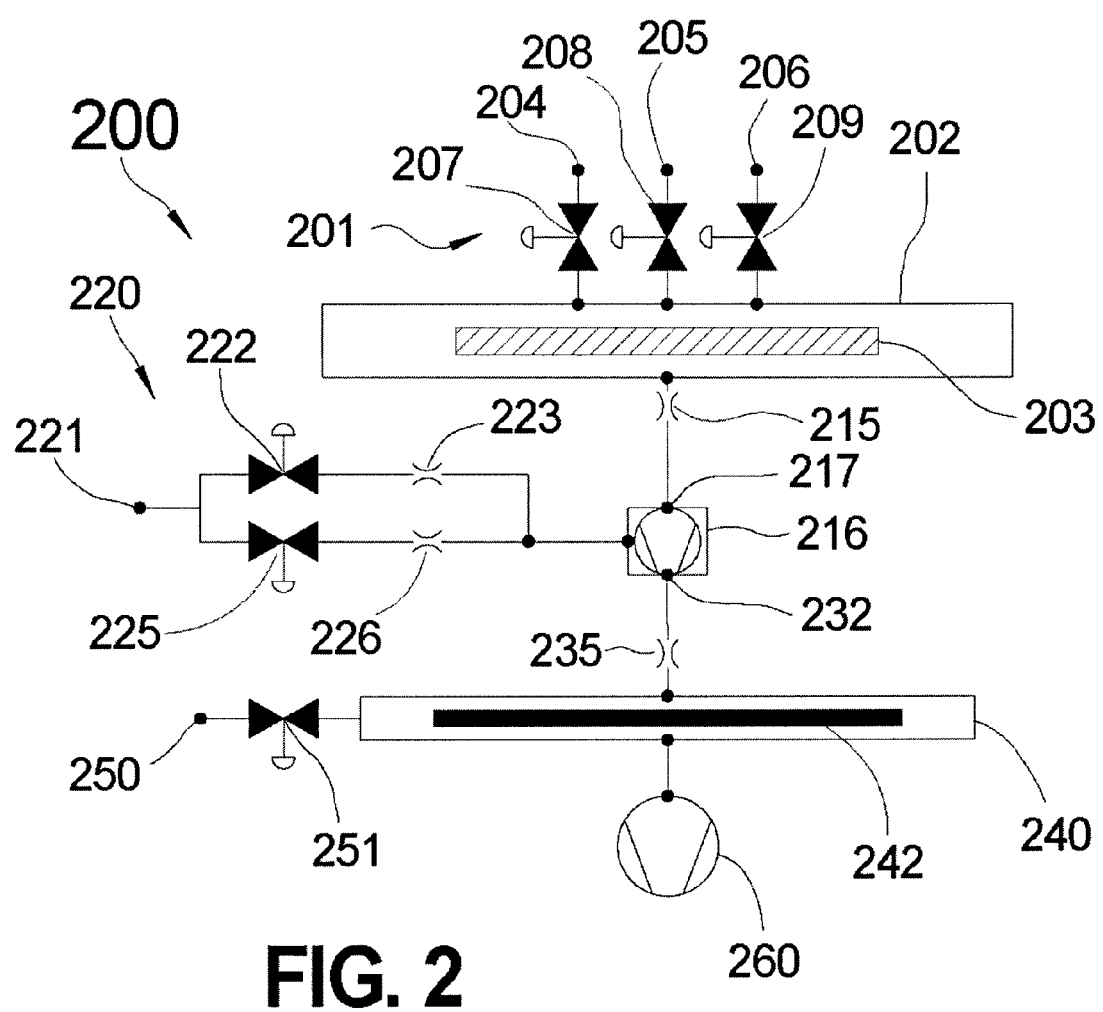
FIG. 2 shows a schematic diagram of an SMFCD ALD system in accordance with an illustrative embodiment of the invention.

FIG. 2 shows a schematic diagram of an illustrative SMFCD ALD system 200 in accordance with an illustrative embodiment of the invention. The SMFCD ALD system comprises a process gas manifold 201 operative to introduce precursor gases and sweep gas into a process space 202 containing a substrate 203. The process gas manifold comprises a first precursor gas source 204, a sweep gas source 205, and a second precursor gas source 206. The flows of these process gases into the process space are regulated by a first precursor gas valve 207, a sweep gas valve 208, and a second precursor gas valve 209, respectively. Further downstream, gas leaving the process space travels through a process space FRE 215 into a GPS 216 through a GPS inlet 217. A draw gas manifold 220 allows a draw gas to be injected into the GPS. The draw gas manifold comprises a draw gas source 221 that is connected to a first draw gas valve 222 and an associated first draw gas FRE 223, as well as to a second draw gas valve 225 and an associated second draw gas FRE 226. Gas leaving the GPS travels through a GPS outlet 232 and a GPS FRE 235 into an abatement space 240, within which lies an abatement surface 242. An abatement gas source 250 is plumbed into the abatement space through an abatement gas valve 251. The system is pumped by a vacuum pump 260.

Advantageously, some of the above-identified elements may be implemented using commercially available parts, although they are combined in novel combinations. The above described gas sources 204, 205, 206, 221, 250 may, for example, comprise conventional gas containers (e.g., gas cylinders) in combination with conventional regulators or conventional electronic pressure controllers. The above-described gas valves 207, 208, 209, 222, 225, 251 may comprise, for example, conventional solenoid valves, piezoelectric valves, electronic fuel injectors, proportional valves, or mass flow controllers (MFCs). Finally, the above-described FREs 215, 223, 226, 232 may comprise adjustable components such as conventional metering valves, proportional valves, heated orifices, or MFCs. The FREs may also be implemented as passive components such as openings and baffles designed into a vacuum chamber, capillaries, or porous materials.

As indicated in FIG. 2, the GPS 216 is in fluidic communication with the process space 202. This, in turn, allows the GPS to at least partially regulate the gas pressures and gas flow rates within the process space. As discovered by Gaede in 1912, the rotating blades of an impeller in a Gaede pump can effectively serve as a pump throughout the molecular and the transition flow regimes that are commonly used to characterize the transport states of gases. The molecular and transition regions of a gas may be defined by a Knudsen Number, $K_N=D/\lambda$, where $\lambda$ is the mean free path of the gas and D is a relevant geometrical factor (e.g., the spacing between blades of the impeller). Gaede pumps reach a maximum, substantially pressure-independent pumping speed within the molecular flow regime of $K_N<1$. In contrast, within the transition flow regime, defined by $1<K_N<110$, the pumping speed falls from higher values at $K_N \leq 1$ down to near zero at $K_N \approx 110$ (where the gas enters its laminar viscous flow regime). Pumping speed and the related compression ratio (i.e., the ratio of the pressure at the pump outlet to the pressure at the pump inlet) are determined by the rotation speed of the impellers, the specific design of the rotating and static elements of the pump, as well as the molecular mass and temperature of the gas. Accordingly, compression ratios are easily adjusted by modifying these parameters in a manner that will be familiar to one skilled in the art.

Figure 1:
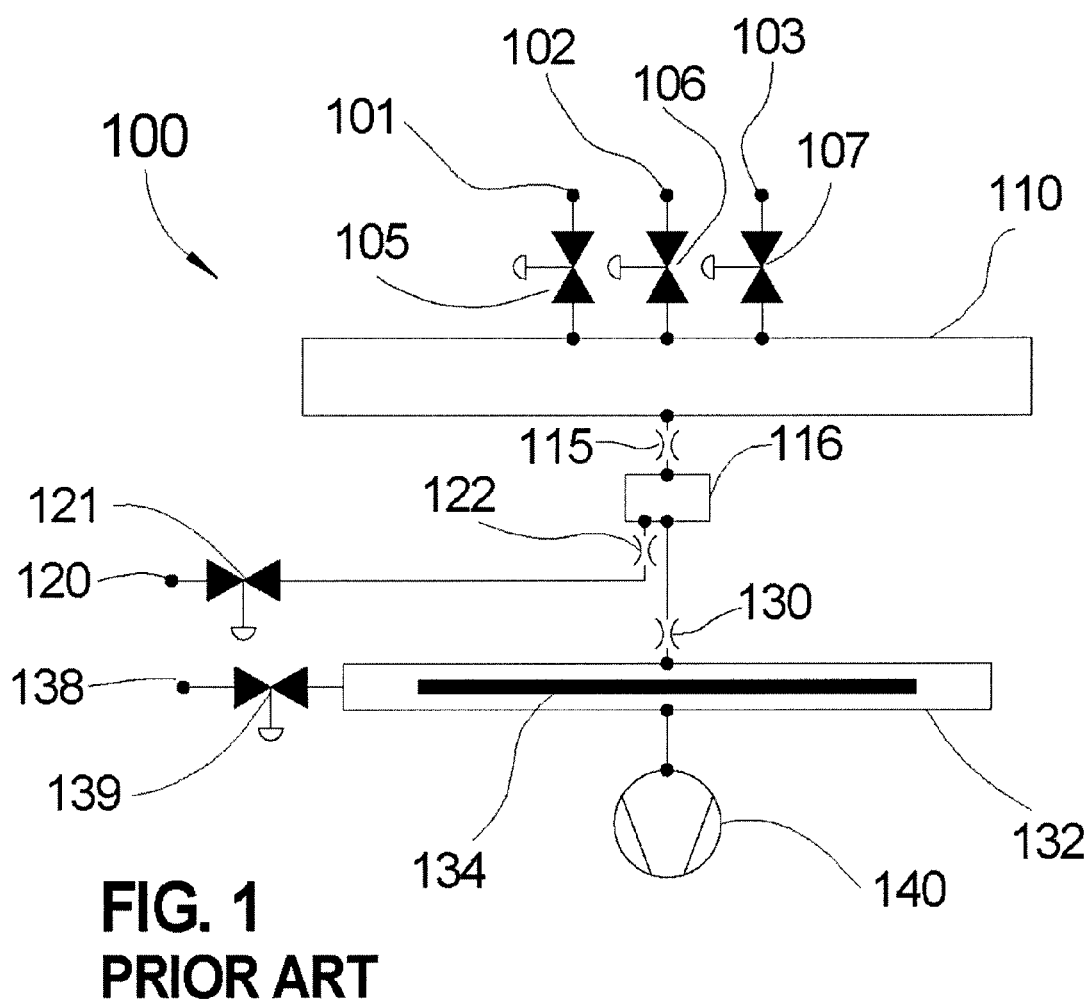
FIG. 1 shows a schematic diagram of an SMFD ALD system in accordance with the prior art.

Like the SMFD ALD system 100 shown in FIG. 1, the SMFCD ALD system 200 in FIG. 2 is designed to deposit a material on a substrate by ALD using a series of process cycles. Each process cycle comprises the six injection, reaction, and sweep sub-steps described earlier. Representative settings for the various valves during these six sub-steps are preferably in accordance with the settings set forth in Table 1.

TABLE 1

| Sub-step | 207 | 208 | 209 | 222 | 225 | 251 |
| --- | --- | --- | --- | --- | --- | --- |
| Injection 1 | Open | Closed | Closed | Open | Closed | Closed |
| Reaction 1 | Periodic | Closed | Closed | Open | Closed | Closed |
| Sweep 1 | Closed | Open | Closed | Closed | Closed | Open |
| Injection 2 | Closed | Closed | Open | Closed | Open | Closed |
| Reaction 2 | Closed | Closed | Periodic | Closed | Open | Closed |
| Sweep 2 | Closed | Open | Closed | Closed | Closed | Open |

As indicated in this table, the draw gas manifold 220 does not inject any draw gas into the GPS 216 during the sweep sub-steps. Rather sweep gas from the sweep gas source 205 is flowed through the process space 202 and the GPS 216 at a sweep gas flow rate, $Q_s$, in order to rid the process space of remaining precursor gas from proceeding reaction sub-steps. This sweep gas flow rate results in $P_{232}^s \approx Q_s/C_{235}+P_{240}^s$ after the pressure is allowed to stabilize, where $C_{235}$ is the conductance of the GPS FRE 235. If the GPS is designed to provide a compression ratio, $K_{GPS}$, of $K_{GPS}=10$ under these conditions, then $P_{202}^s \approx P_{232}^s/10$ after stabilizing, assuming that the process space FRE 215 has a high enough conductance that $P_{202}^s \approx P_{217}^s$. Accordingly the sweep gas residence time in the process space, $\tau_{202}^s$, is:

$$\tau_{202}^s = \frac{V_{202} \times P_{232}^s}{10 \times Q_s} \quad (3)$$

where $V_{202}$ is the free-space volume of process space.

In contrast, as further indicated in Table 1, during the injection sub-steps, the process gas manifold 201 injects either the first precursor gas or the second precursor gas into the process space 202 while the draw gas manifold 220 concurrently injects draw gas into the GPS 216. If, as is preferable, the gas flow rate of the draw gas, $Q_{DG}$, is set such that $Q_{DG} > Q_s$, $P_{232}{}^i$ increases and the $K_{GPS}$ decreases, resulting in $P_{202}{}^i > P_{202}{}^s$ after $P_{202}{}^i$ has had a chance to stabilize. For example, if $K_{GPS} \approx 2$ and $P_{232}{}^i \approx 1.5 P_{232}{}^s$ then $P_{202}{}^i = 7.5 P_{202}{}^s$ at the end of the injection sub-step. During the injection sub-step, $P_{217}{}^i$ is preferably synchronized with the reactive precursor injection flow such that the increase in $P_{202}{}^i$ predominantly corresponds to the injection of precursor gas. Advantageously, a factor of about 7.5 pressure increase in the process space represents ALD precursor loading up to greater than about 86% with virtually no wasted chemical.

Following the injection sub-step, the appropriate precursor gas valve 207, 209 is switched off while the draw gas manifold 220 maintains $Q_{DG}$. This acts to maintain the pressure of the precursor gas in the process space 202 that was achieved by the prior injection sub-step (i.e., $P_{202}{}^r \approx P_{202}{}^i$). During the reaction sub-steps, additional periodic injections of precursor gas may be used to replenish depleted precursor gas by sequencing the appropriate precursor gas valve 207, 209 as necessary. Since $P_{202}{}^r \approx P_{217}{}^r$, the pressure drop across the process space FRE 215 is effectively about zero (i.e., $\Delta P_{Draw} \approx 0$), causing little or no flow across this FRE and effectively isolating the process space 202 from the GPS 216. Any transient differences between $P_{217}{}^r$ and $P_{202}{}^r$ will result in a rapid self correction of $P_{202}{}^r$ to match $P_{217}{}^r$ following the shutoff of the precursor gas valve.

As can be seen from the previous discussion, methods and apparatus in accordance with aspects of this invention utilize $K_{GPS}$ to modulate the pressure and gas flow rate in the process space 202. Preferably, the GPS 216 is designed to maintain a compression ratio $\sim 10 < K_{GPS} < \sim 50$ under the low-pressure/high-gas-flow-rate conditions best suited for the sweep sub-steps. High-pressure/low-gas-flow-rate conditions best suited for the injection and reaction sub-steps are triggered by a flow surge of draw gas into the GPS. The flow surge quickly elevates $P_{232}{}^i$ pushing the point where $K_N \approx 110$ and $K_{GPS} = 1$ upstream in the GPS (i.e., the flow surge causes a least a portion of the gas in the GPS to be in its laminar viscous flow regime where there is little or no compression). As a result the total compression ratio modulates into a lower level. The combination of higher $P_{232}{}^i$ and a lower $K_{GPS}$ leads to a higher $P_{202}{}^r$. Because the draw gas manifold 220 utilizes the first draw gas valve 222 and the first draw gas FRE 223 to inject draw gas into the GPS during the first injection/reaction sub-steps, and because the draw gas manifold utilizes the second draw gas valve 225 and the second draw gas FRE 226 to inject draw gas into the GPS during second injection sub-steps, $Q_{DG}$ can be made different for the first and second injection/reaction sub-steps, if so desired. As a result, $P_{202}{}^r$ may be more readily tailored to each precursor gas. If desired, it is also contemplated that a different draw gas composition may be utilized during the first and second injection/reaction sub-steps rather than using a single composition for both.

As indicated earlier, the time required to achieve saturation of a given ALD reaction sub-step is typically determined by the rate of precursor gas molecules impinging on the substrate 203. This rate of impingement (i.e., flux), $\phi$, is proportional to the partial pressure of the precursor gas in the process space 202. As a result, the ability to achieve higher $P_{202}{}^r$ by injecting precursor gas into the process space while concurrently injecting draw gas into the GPS 216 provides an opportunity to substantially speed up the reaction time. Real-world experience with prior-art SMFD ALD systems suggests that methods and apparatus in accordance with aspects of the present invention may be able to achieve process space pressures during reaction sub-steps of about 5 to about 10 times higher than those that can be achieved by prior art systems. This, in turn, represents the opportunity to speedup reaction times by that factor. For example, the pressure in the process space may be raised from about 50 milli-Torr (mTorr) during sweep sub-steps up to about 375 mTorr during the reaction sub-steps using the SMFCD ALD system 200. At 86% concentration, the partial pressure of 322.5 mTorr corresponds, for example, to a trimethylaluminum (TMA) (a common first precursor gas) $\phi \approx 6.5 \times 10^{19}$ molecules per square centimeter per second at 150° C. Under these conditions, the TMA reaction will saturate within less than about 30 ms at 150° C. and less than about 8 ms at 300° C. These reaction saturation times represent substantial improvement to the art of ALD.

In addition, aspects of the invention may allow the implementation of process spaces larger than those contemplated in the prior art, thereby allowing ALD to be performed on larger substrates. As indicated by equation (3) above, $\tau_{202}{}^s$ is reduced by $1/K_{GPS}$ when using a GPS in the manner described herein. As a result, a substantially larger process space volume, $V_{202}$, may be effectively swept for a given sweep sub-step time than would be the case without GPS compression. Furthermore, the high speed rotation of the GPS impeller acts to substantially average over any draw gas injection non-uniformities in the GPS and any spatial non-uniformities in the process space FRE 215. These improved gas dynamics may act to reduce any undesirable spatial pressure gradients in the associated process space during injection and reaction sub-steps. This too provides the opportunity to implement larger process spaces for which pressure non-uniformities may have previously been a concern.

Moreover, injection of draw gas into the GPS 216 has added advantages with respect to abatement. The injection of draw gas into the GPS substantially isolates the process space 202 from the abatement space 240. This allows the choice of abatement gas from abatement gas source 250 to not affect the ALD process itself. Furthermore, because the GPS is compressing the gas that passes through it during the sweep sub-steps, $P_{232}{}^s$ is substantially higher than it would be in a system without such compression. This facilitates higher pressure abatement reactions without the risk of abatement gases back-streaming into the GPS or into the process space.

As indicated earlier, a GPS with a moderate $K_{GPS}$ in the range of between about 10 and about 50 is preferable for SMFCD ALD applications. As can be appreciated by those who are skilled in the art, currently available Gaede pumping devices such as turbomolecular pumps and molecular drag pumps may not be suitable for SMFCD ALD applications for a variety of reasons. In particular, these types of available devices typically have a large volume and/or excessive compression ratio. In the case of turbomolecular pumps, commercially available pumping devices typically have multiple stages wherein rotors combine multiple impellers into a single integral rigid unit. These impellers typically integrate into a staggered arrangement of matching stators to facilitate high compression. Accordingly, these devices have a very high compression ratio and are not adequate for SMFCD ALD and, similarly, are not readily suitable for modifications and adaptation to an SMFCD ALD apparatus. Operating these commercial Gaede pumping devices at lower speed could be used to suppress their otherwise very large compression ratios, but their large volumes and reduced base conductance makes them slow to respond. Likewise, in the case of molecular drag pumps, low inlet conductances are contradictory to optimized SMFCD ALD methods and apparatus.

Figure 3:
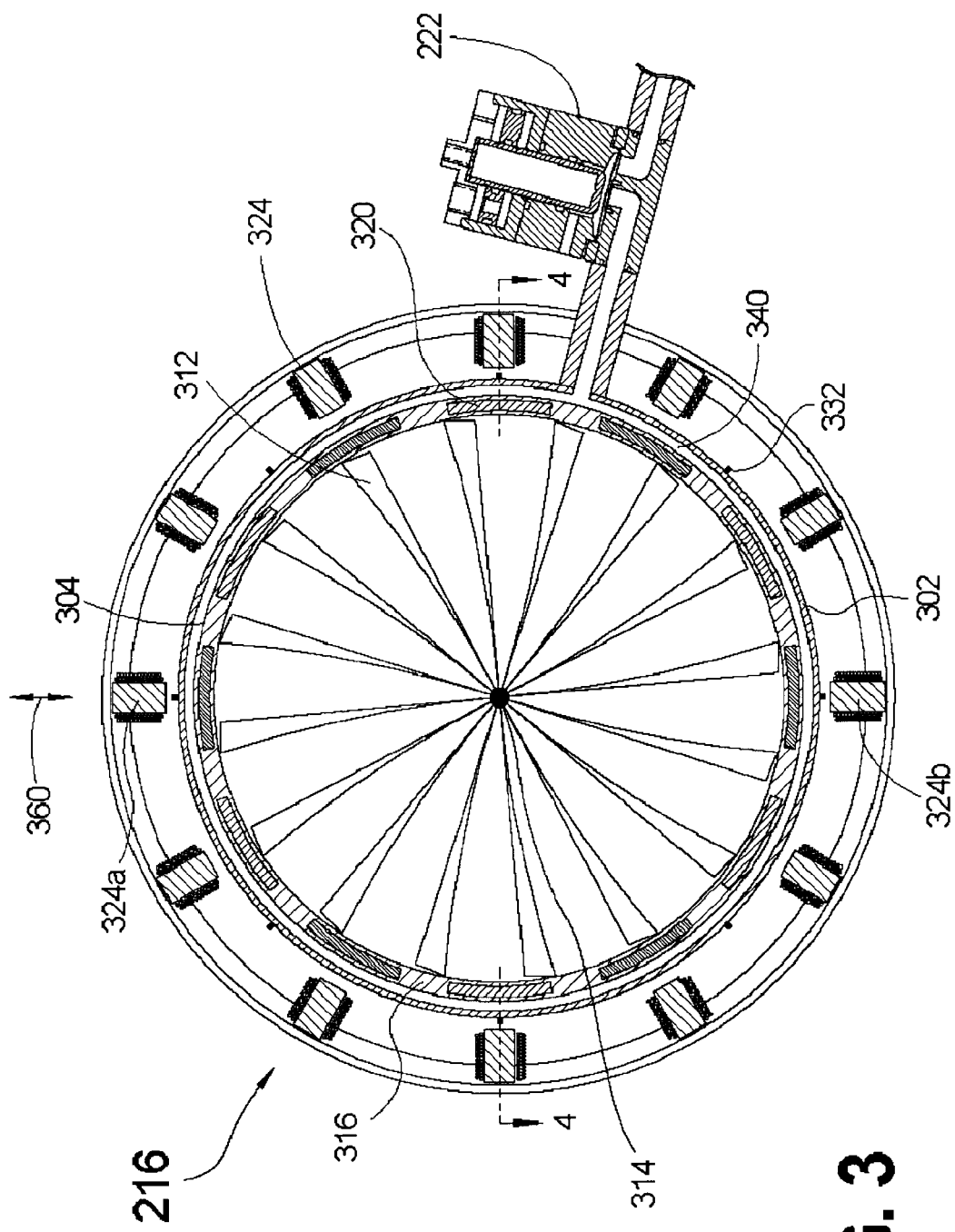
FIG. 3 shows a plan view of an illustrative single-impeller GPS for use in the FIG. 2 SMFCD ALD system.
Figure 4:
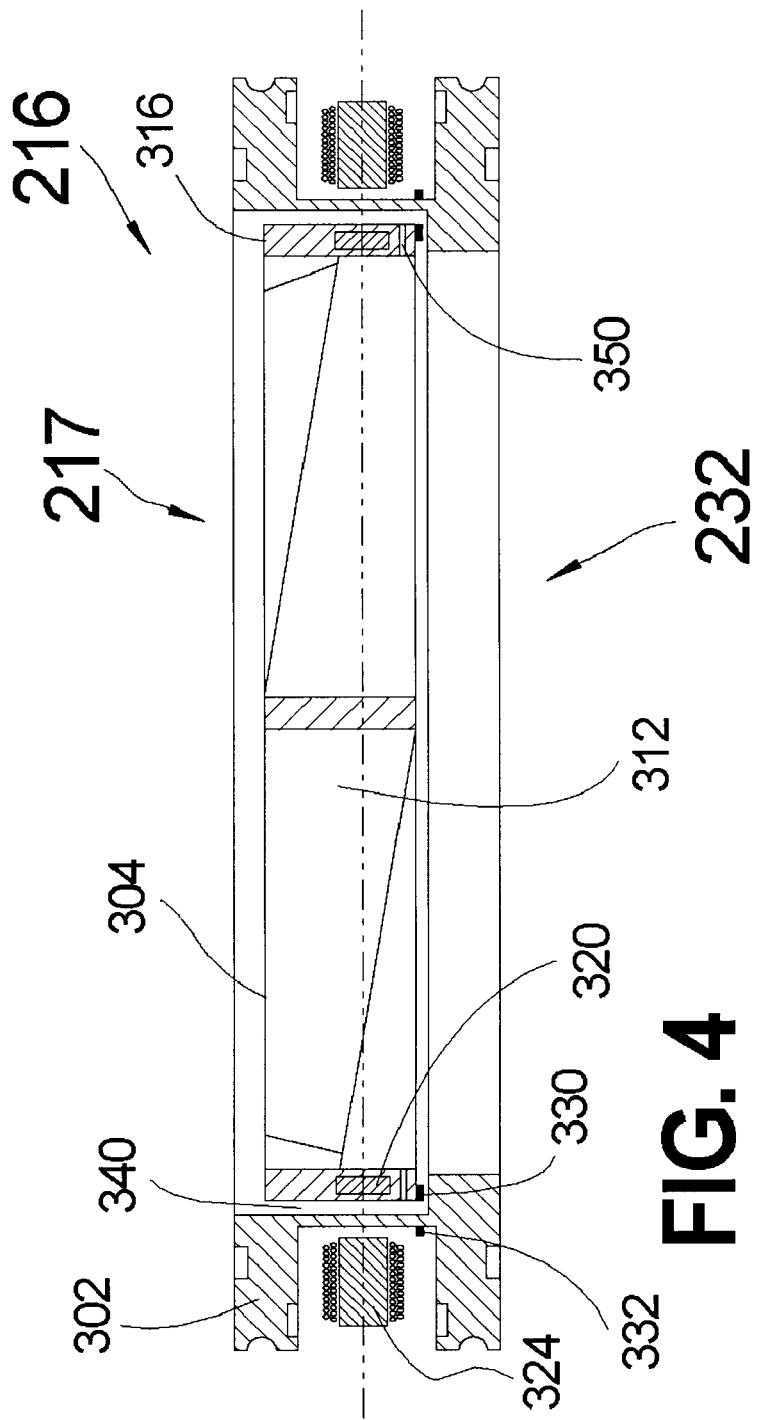
FIG. 4 shows a sectional view of the FIG. 3 GPS.
Figure 5:
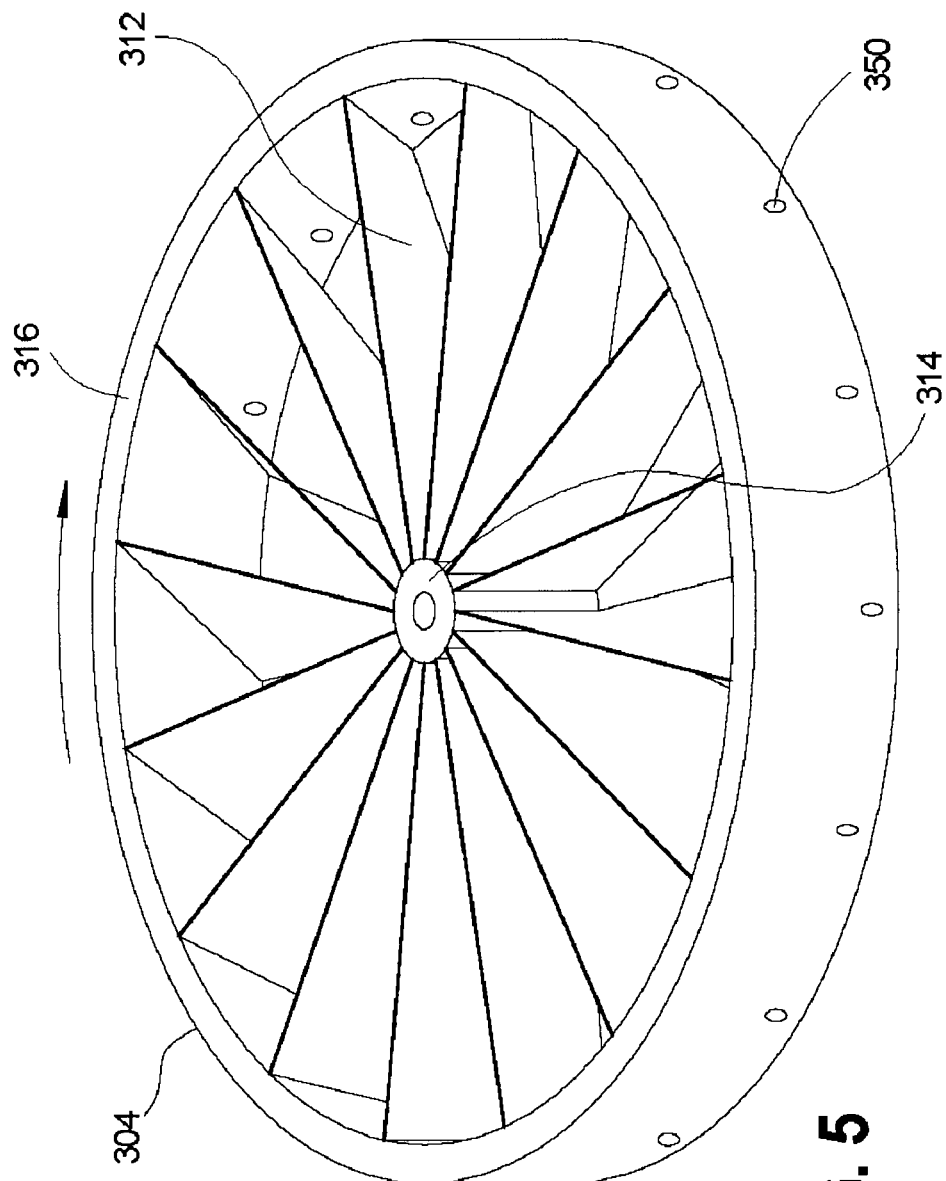
FIG. 5 shows a perspective view of the impeller in the FIG. 3 GPS.

Given the requirement for a rather moderate $K_{GPS}$, GPS designs implementing one or two high-speed rotating impellers may be satisfactory for SMFCD ALD applications, and, advantageously, may also be implemented within low-profile, low-volume modules. FIGS. 3 and 4 show a plan view and a sectional view, respectively, of a single-impeller GPS 216 for use the SMFCD ALD system 200. The GPS comprises a ring-shaped enclosure 302 that laterally surrounds an impeller 304, which is also shown in perspective view in FIG. 5. The impeller comprises an array of twisted blades 312, each blade emerging radially at a small angle, (e.g., about five degrees) from an inner hub 314 and smoothly twisting to a larger angle (e.g., about 45 degrees) at the perimeter-end where it is attached to an outer rim 316. Permanent magnets 320 with alternating polarity orientations are embedded into the outer rim of the impeller, and a complementary set of electromagnetic coils 324 are disposed on the ring-shaped enclosure proximate to these permanent magnets and the outer rim. An array of position sensors 330 is also evenly distributed on the outer rim of the impeller and their corresponding position detectors 332 are placed in opposition on the ring-shaped enclosure. Signals provided by the position sensors and the position detectors are used to provide feedback for magnetic levitation and rotation control by a controller, as is known in the art.

It will be noted that the first draw gas valve 222 is also shown in the sectional view in FIG. 3. (The second draw gas valve 225 is not shown for simplicity of presentation.) Once the first draw gas valve is opened, the draw gas is injected into a gap 340 in the GPS 216 between the ring-shaped enclosure 302 and the outer rim 316 of the impeller 304. The impeller includes radially distributed feed holes 350 that act to transport at least some of the injected draw gas from the gap to the blades 312 of the impeller. Given the high-speed rotation of the impeller (e.g., about 30,000 rotations per minute), the GPS can be expected to substantially ameliorate any draw gas distribution imperfections due to, for example, manufacturing tolerances of these feed holes.

To rotate the impeller 304 in the GPS 216, alternating current is fed to the electromagnetic coils 324 to effectively create a permanent magnet synchronous motor (PMSM), which will be familiar to those skilled in the art. Moreover, in accordance with aspects of the invention, the electromagnetic coils are also used to spatially center the impeller within the ring-shaped enclosure 302. This spatial positioning is performed by purposefully creating magnetic force differences between pairs of electromagnetic coils located on opposing sides of the ring-shaped enclosure. For example, when the position indicators 332 indicate that the impeller has drifted laterally from center in direction 360 in FIG. 3, the magnitude of the current through electromagnetic coil 324A is made different from that in electromagnetic coil 324B so that the magnetic force created by each electromagnetic coil is not equal. These unequal magnetic forces act to deflect the impeller back to its centered position within the ring-shaped enclosure.

The impeller 304 is preferably constructed out of light weight material such as aluminum, titanium, or high strength plastics to reduce both driving and levitation power consumption. Conventional molding or casting techniques are suitable for constructing the impellers with embedded permanent magnets 320. Advantageously, the GPS 216 does not require bearings and vacuum-compatible motors and/or can-assemblies which are commonly implemented for suspending and driving impellers in Gaede pumps. These components may disadvantageously add volume and potentially corroding components into the exhaust flow path.

For illustrative purposes, the ring-shaped enclosure 302 of the GPS 216 has dimensions similar to that of a conventional two-inch long ISO160 flange. Advantageously, forming the GPS in this manner acts to limit the size of the free space within the GPS and also makes the GPS easy to integrate with other standard-sized vacuum elements. A two-inch-long ISO160-based GPS, for example, defines a free volume of only about one liter. This small volume allows extremely fast pressure/gas-flow-rate transitions within the GPS (e.g., <1 ms). On the other hand, forming the GPS is this manner may act to limit the pumping speed of the GPS. An ISO160 flange has an open area conductance of about 2,300 liters per second (l/s). However, unlike an open flange, only the area between the blades 312 of the impeller 304 is effectively open in the GPS 216. As a result, the GPS may only have a conductance of about 2,000 l/s. Nevertheless, even though limited by conductance to this pumping speed value, suitable low-pressure/high-gas-flow-rate conditions may still be obtained during sweep sub-steps. If the SMFCD ALD system 200 is run such that $Q_s$=8 standard liters per minute (sLm) (a very reasonable value), for example, $P_{217}{}^s \approx 50$ mTorr with a pumping speed of 2,000 l/s. Under these conditions, a 50 liter free-volume process space 202 will have a characteristic $\tau_{202}{}^s \approx 25$ ms. This means that any un-reacted precursor gases in the process space will be adequately swept within only about 125 ms (i.e. $5\,\tau_{202}{}^s$).

If $K_{GPS}$=10 and $P_{217}{}^s \approx 50$ mTorr, $P_{232}{}^s \approx 0.5$ Torr. In such a case, the vacuum pump 260 in the SMFCD ALD system 200 may comprise, as just one example, a moderately sized roots blower pump. One such commercially available roots blower pump is the Okta WKP2000 available from Pfeiffer Vacuum (Asslar, Germany). With an ISO160 inlet, this pump can handle up to 22 sLm of gas flow at 0.5 Torr. Remarkably, the moderate $K_{GPS}$ alleviates the need for extremely large pumps. For example, if $K_{GPS}$=1, $Q_s$=8 sLm, and $P_{232}{}^s$=50 mTorr, a tremendously large roots blower pump such as the Okta WKP18000 and an ISO400 pumping port might be required. On a comparative basis, the Okta WKP18000 has dimensions of about 2,630×1,460×1,000 millimeters (mm) length times width times height ("L×W×H") while the Okta WKP2000 has dimensions of only about 1,304×502×420 mm L×W×H.

Figure 6:
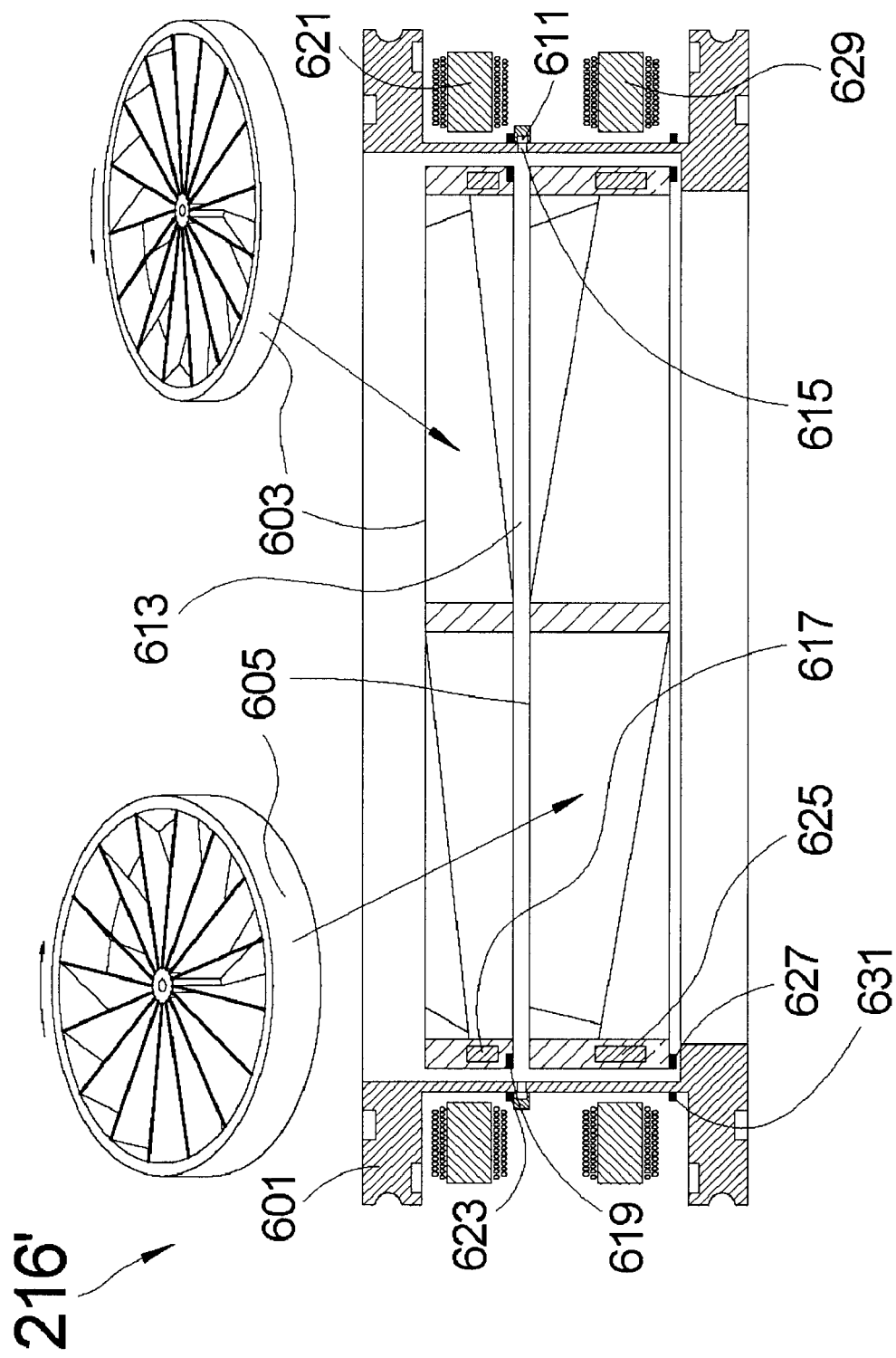
FIG. 6 shows a sectional view of an illustrative double-impeller GPS for use in the FIG. 2 SMFCD ALD system.

The GPS 216 used in the SMFCD ALD system 200 may be configured with multiple impellers. FIG. 6 shows a sectional view of a double-impeller GPS 216' for use in the SMFCD ALD system. This GPS embodiment comprises a ring-shaped enclosure 601 that laterally surrounds an upper impeller 603 and a lower impeller 605. The upper impeller rotates in a counter-clockwise direction while the lower impeller rotates in a clockwise direction (i.e., the two impellers rotate in opposite directions relative to one another). Draw gas is fed into a planetary manifold 611 (i.e., a gas pathway that orbits the ring-shaped enclosure) and is further injected into a gap 613 between the impellers through a set of holes 615. To facilitate levitation and rotation, the upper impeller is equipped with upper permanent magnets 617 and upper position sensors 619, and is surrounded by upper electromagnetic coils 621 and upper position detectors 623. Likewise, the lower impeller is equipped with second permanent magnets 625 and second position sensors 627, and is surrounded by second electromagnetic coils 629 and second position detectors 631. Note the insets showing the opposite blade designs of the two impellers, which accommodate their opposite directions of rotation. Opposite directions of rotation provide passive compression ratio enhancement as known in the art for Gaede pump designs. However, given the mild compression needed for the GPS, double-impeller designs with rigidly coupled impellers that rotate in the same direction may also be appropriate for SMFCD ALD. Rigidly coupled impellers may provide higher compression ratios if a stator with opposite blade directions is placed in the gap between the impellers. A double-impeller design may provide better definition of draw gas spatial injection and a higher $K_{GPS}$ at the cost of additional complexity and possibly a somewhat extended transition time.

Figure 7:
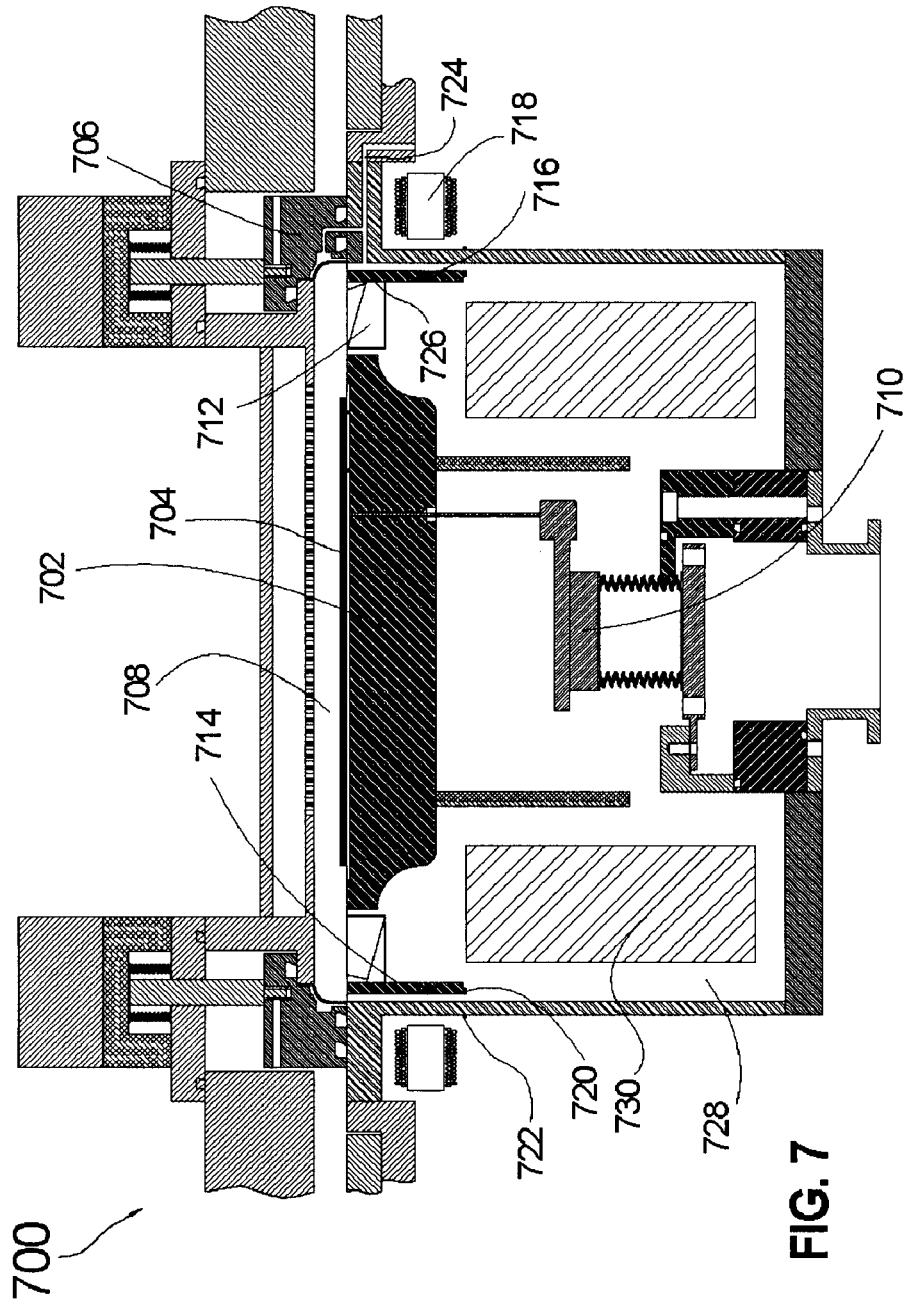
FIG. 7 shows a sectional view of a wafer-processing SMFCD ALD system in accordance with an illustrative embodiment of the invention.

FIG. 7 shows an SMFCD ALD system 700 in accordance with an illustrative embodiment of the invention that is suitable for depositing materials on substrates such as semiconductor wafers. The SMFCD ALD system comprises a heated stage 702 adapted to hold a substrate 704, and a slit-valve 706 that defines a process space 708. The slit-valve is operative to be raised and lowered in order to insert and remove the substrate, which is further facilitated by a lift-pin mechanism 710. The lift-pin mechanism is adapted to raise the substrate off of the heated stage during substrate transfer operations. A ring-shaped impeller 712 forms the GPS for the system and laterally surrounds and rotates around the heated stage. To facilitate levitation and rotation, the ring-shaped impeller comprises an extended outer rim 714 in which permanent magnets 716 are embedded across from electromagnetic coils 718. The extended outer rim is useful to locate the permanent magnets below the congested area comprising the slit-valve. Position sensors 720 and position detectors 722 are implemented in manner similar to that described above. Draw gas is fed into the GPS through a planetary manifold 724 and is allowed to pass to the blades of the impeller through radially distributed holes 726 in an upper portion of the ring-shaped impeller's outer rim. Downstream from the ring-shaped impeller, an abatement space 728 is equipped with an abatement surface 730.

Figure 8:
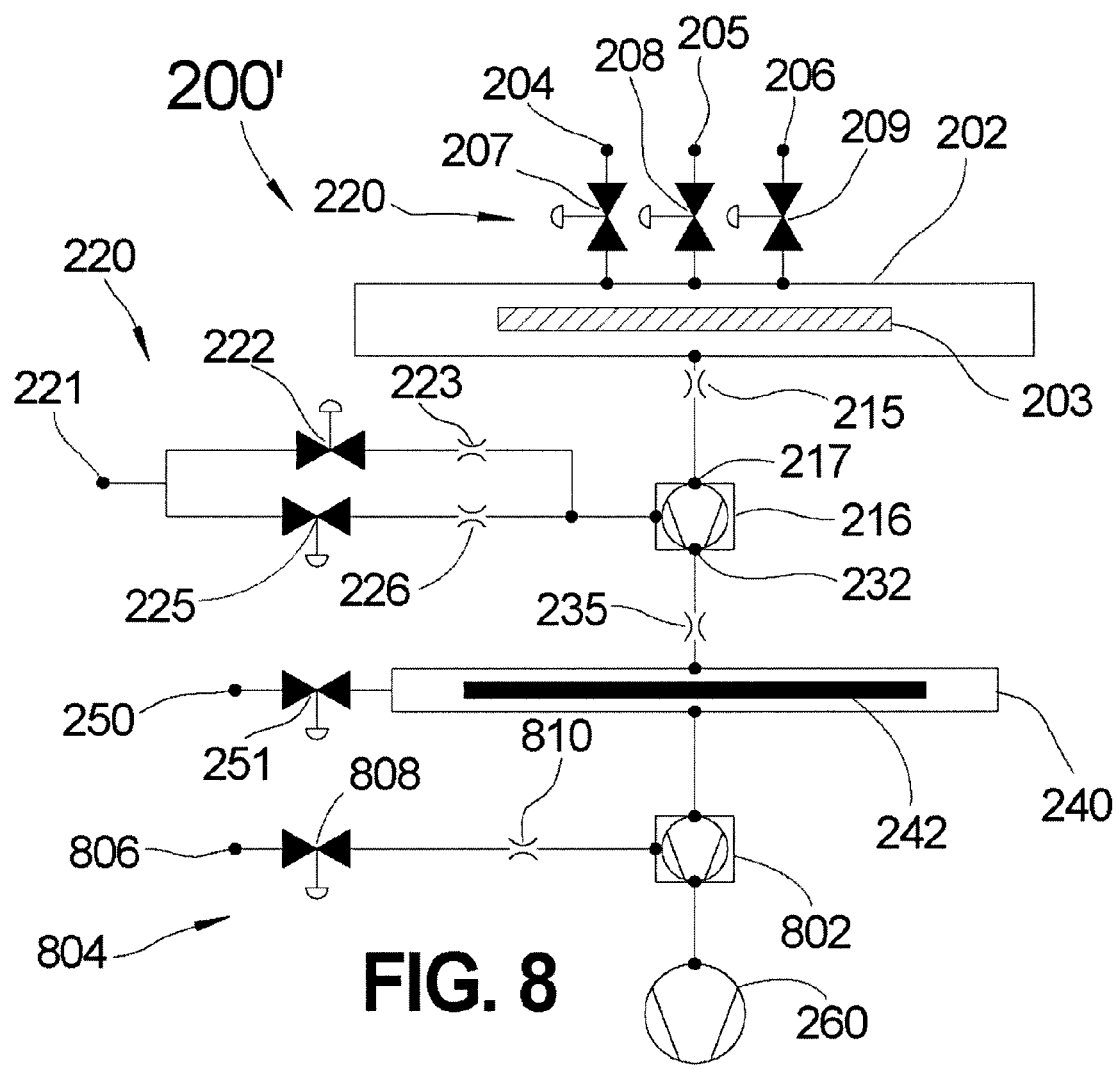
FIG. 8 shows a schematic diagram of the FIG. 2 SMFCD ALD system with the addition of an abatement GPS.

Finally, FIG. 8 shows a schematic diagram of an SMFCD ALD system 200'. This system is identical to the SMFCD system 200 in FIG. 2 except for the addition of an abatement GPS 802 at the outlet of the abatement space 240, as well as the addition of an abatement draw gas manifold 804. As a result, for ease of understanding, elements that are the identical in both the SMFCD ALD system 200' and the SMFCD ALD system 200 are labeled with identical reference numerals. In the SMFCD ALD system 200', the abatement draw gas manifold comprises an abatement draw gas source 806, an abatement draw gas valve 808, and an abatement draw gas FRE 810. The abatement draw gas manifold is preferably utilized to temporarily raise the pressure in the abatement space during an initial period of each sweep sub-step by injecting draw gas into the abatement GPS. This initial period may, for example, last between about $\tau_s$ and about $2\,\tau_s$ when the sweep sub-step has a total period of about $5\,\tau_s$. These synchronized pressure-up modulations boost the abatement process efficiency in the abatement space during the initial periods of the sweep sub-steps in order to obtain improved handling of precursor waste from the process space 202. Experience indicates that the amount of precursor waste entering the abatement space is substantially greater during the initial periods of the sweep sub-steps than it is in the latter portions of the sweep sub-steps.

It should again be emphasized that the above-described embodiments of the invention are intended to be illustrative only. Other embodiments can use different types and arrangements of elements for implementing the described functionality. For example, rather than implementing a GPS in the manners shown in FIGS. 3-7, a GPS could be implemented using a conventional impeller levitation and drive design wherein an impeller is supported by mechanical bearings and/or driven by a vacuum-compatible mechanical motor. Alternatively, an SMFCD ALD system in accordance with aspects of the invention may be configured so that more than one composition of sweep gas, more than one composition of draw gas, and/or more than one composition of abatement gas are available and utilized in a single ALD process cycle. These numerous alternative embodiments within the scope of the invention will be apparent to one skilled in the art.

In so much as aspects of the present invention teach methods of manufacture, the invention is further intended to encompass products of manufacture that are formed at least in part using these methods. Moreover, all the features disclosed herein may be replaced by alternative features serving the same, equivalent, or similar purpose, unless expressly stated otherwise. Thus, unless expressly stated otherwise, each features disclosed is one example only of a generic series of equivalent or similar features.

What is claimed is:

1. A method for depositing a material on a substrate, the method comprising the steps of:
   placing the substrate into a process space in fluidic communication with a Gaede pump stage (GPS);
   injecting a precursor gas into the process space while injecting a draw gas at a draw gas flow rate directly into the GPS such that the injected precursor gas achieves a precursor pressure and a precursor gas flow rate in the process space; and
   sweeping substantially all of the precursor gas remaining in the process space from the process space by injecting a sweep gas into the process space such that the injected sweep gas achieves a sweep pressure and sweep gas flow rate in the process space;
   wherein the precursor gas flow rate is lower than the sweep gas flow rate.

2. The method of claim 1, wherein the precursor pressure is higher than the sweep pressure.

3. The method of claim 1, further comprising the step of injecting a second precursor gas into the process space while injecting a second draw gas at a second draw gas flow rate directly into the GPS such that the injected second precursor gas achieves a second precursor pressure and a second precursor gas flow rate in the process space, the second precursor gas flow rate being lower than the sweep gas flow rate.

4. The method of claim 3, wherein the second precursor pressure is higher than the sweep pressure.

5. The method of claim 3, wherein the second draw gas has substantially the same composition as the draw gas.

6. The method of claim 3, wherein the second draw gas flow rate is substantially the same as the draw gas flow rate.

7. The method of claim 3, wherein the second precursor pressure differs from the precursor pressure.

8. The method of claim 1, wherein depositing the material comprises atomic layer deposition.

9. The method of claim 1, wherein the draw gas flow rate is higher than the sweep gas flow rate.

10. The method of claim 1, wherein the GPS displays a lower compression ratio while the precursor gas is injected into the process space than it does while the sweep gas is injected into the process space.

11. The method of claim 1, wherein the GPS displays a compression ratio between about 10 and about 50 while the sweep gas is injected into the process space.

12. The method of claim 1, wherein the sweep gas injected into the process space displays a residence time less than about 25 milliseconds.

13. The method of claim 1, wherein the GPS is operative to switch between the precursor pressure and the sweep pressure in less than about five milliseconds.

14. The method of claim 1, further comprising the step of passing the precursor gas swept from process space by the sweep gas through an abatement space, the abatement space comprising an abatement surface on which the precursor gas may be converted to a film in the presence of an abatement gas.

15. The method of claim 14, further comprising the step of modulating a pressure in the abatement space from a first abatement pressure to a second abatement pressure while injecting sweep gas into the process space, the first abatement pressure being higher than the second abatement pressure.

* * * * *